(12) United States Patent
Hosono

(10) Patent No.: US 6,967,874 B2
(45) Date of Patent: Nov. 22, 2005

(54) NON-VOLATILE SEMICONDUCTOR MEMORY DEVICE AND ELECTRIC DEVICE WITH THE SAME

(75) Inventor: Koji Hosono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/862,538

(22) Filed: Jun. 8, 2004

(65) Prior Publication Data

US 2005/0018489 A1    Jan. 27, 2005

(30) Foreign Application Priority Data

Jun. 30, 2003    (JP) .............................. 2003-188537

(51) Int. Cl.[7] .......................... G11C 16/04; G11C 16/06
(52) U.S. Cl. ............................ 365/185.33; 365/185.11; 365/185.17; 365/185.25
(58) Field of Search ...................... 365/185.33, 185.11, 365/185.12, 185.17, 185.25, 185.29

(56) References Cited

U.S. PATENT DOCUMENTS

| | | | |
|---|---|---|---|
| 4,858,194 A | * | 8/1989 | Terada et al. .......... 365/185.25 |
| 5,511,022 A | * | 4/1996 | Yim et al. ............. 365/185.17 |
| 6,023,423 A | * | 2/2000 | Aritome ................ 365/185.11 |
| 6,144,582 A | * | 11/2000 | Atsumi et al. ......... 365/185.11 |
| 6,711,058 B1 | * | 3/2004 | Hirano ................. 365/185.11 |

FOREIGN PATENT DOCUMENTS

| | | |
|---|---|---|
| JP | 9-180482 | 7/1997 |
| JP | 10-188578 | 7/1998 |

* cited by examiner

Primary Examiner—Son Mai
(74) Attorney, Agent, or Firm—Oblon, Spivak, McClelland, Maier & Neustadt, P.C.

(57) ABSTRACT

A non-volatile semiconductor memory device includes: a cell array having electrically rewritable and non-volatile memory cells disposed at the respective intersections of word lines and bit lines intersecting each other; a row decoder circuit for selectively driving a word line of the cell array; a sense amplifier circuit disposed in communication with the cell array for data reading and writing; and a controller for executing sequence control of data write and erase, wherein in a data erase cycle controlled by the controller to erase memory cells disposed along at least one selected word line of the cell array, an adjacent/non-selected word line which is non-selected and adjacent to the selected word line in non-selected words lines in the cell array is precharged to a first erase-inhibition voltage, while the remaining non-selected word lines are precharged to a second erase-inhibition.

17 Claims, 10 Drawing Sheets

Erase

Verify

NON-VOLATILE SEMICONDUCTOR MEMORY DEVICE AND ELECTRIC DEVICE WITH THE SAME

CROSS-REFERENCE TO RELATED APPLICATION

This application is based on and claims the benefit of priority from the prior Japanese Patent Application No. 2003-188537, filed on Jun. 30, 2003, the entire contents of which are incorporated herein by reference.

BACKGROUND OF THE INVENTION

1. Field of the Invention

This invention relates to a non-volatile semiconductor memory device and an electric device with the same.

2. Description of Related Art

Currently known EEPROMs are mostly formed of memory cells floating gates of which store data charge. Arranging NAND cell units each having a plurality of memory cells connected in series, a cell array of a NAND-type flash memory which is known as one of the EEPROMs is constructed. Source and drain diffusion layers of the memory cells in the NAND cell unit are shared with adjacent cells. To increase the capacity of the NAND-type flash memory, it is effective to increase the number of cells in the NAND cell unit, thereby increasing the capacity of a block defined as a group of a plurality of NAND cell units sharing a word line with them. Since one block is serves as a unit for data erasing at a time, increasing the block capacity, the data erase unit of the NAND-type flash memory becomes large.

If only small capacity data is written in such a large block of the NAND-type flash memory, the remaining area of the block becomes wasteful. In consideration of this point, in practice, one block is often divided into a few or several areas, and data control is performed by each area. However, using the above described erasing scheme in which a block is adapted to a data erase unit, it takes an extra time for data rewriting. In detail, assume, for example, that a data A area and data B area are defined in a block. In order to replace the data A by data C, it is required to do at least one block erase operation and write operations of data A and C. That is, as a result of that the entire block is erased prior to data C writing, it is necessary to write the data A again. This brings an overhead time in data processing.

To decrease such the overhead time in the data rewriting operation, it is effective to do a data erase operation by every word line (i.e., page). Such a selective data erase (i.e., page erase) may be done by setting word lines in a non-selected area at a floating state, applying 0V to word lines in a selected area, and applying a erase voltage to a p-type well on which the cell array is formed. Under such the condition, stored charge of the respective floating gates is discharged to the channel by FN tunneling in the memory cells in the selected area, whereby an erase state with a low threshold voltage (i.e., data "1" state) is obtained in every selected cell. In the non-selected area, the word lines (i.e., control gates), which are in a floating state, are boosted by capacitive coupling in accordance with increasing of the erase voltage applied to the p-well to be an "erase-inhibition" state. Therefore, by use of such the erase method, it becomes possible to do data write for only a selected area in a block, which is required to be rewritten. Such the erase method has already been provided in, for example, Japanese Patent Application (kokai) No. 10-302488 and U.S. Pat. No. 6,107,658.

However, in the above described selective erase method, there is a problem that the erase-inhibition states in the non-selected area are not uniform, and a large erase stress is applied to a cell adjacent to the selected area. This situation will be explained in detail referring to FIGS. 9 and 10. These show voltage relationships in a NAND cell unit in a selective data erase mode. In these figures, word lines WL0–3 are selected pages, and word lines WL4–7 are non-selected pages. FIG. 9 shows a state just before the erase voltage Vera(=20V) application. In this state, non-selected word lines WL4–7 are precharged to Vdd–Vtn (Vtn: threshold voltage of a transfer transistor for transferring a word line driving voltage) to be floating.

In this state, applying the erase voltage Vera to the p-type well, the voltage relationships of FIG. 10 are obtained. In the non-selected area, word line WL4 adjacent to a selected word line becomes to be a floating state of Vdd–Vtn+βVera (β: coupling coefficient), while the remaining non-selected word line WL5–7 to be a floating state of Vdd–Vtn+αVera (α: coupling coefficient). The coupling coefficients β and α have a relationship of β<α. The reason of this will be explained bellow referring to FIG. 11.

As shown in FIG. 11, giving attention to a memory cell selected by a word line WLi, the coupling coefficient is defined by coupling capacitances C1 to C4 of the floating gate and control gate and voltages thereof. The word line WL4 in the non-selected word lines WL4–7 is adjacent to a selected word line WL3 to which 0V is applied. As a result, the voltage boost of the word line WL4 is more suppressed in comparison with other non-selected word lines WL5–7, whereby the relation ship of β<α will be obtained. In other words, one of the non-selected word lines, which is adjacent to a selected word line, is not boosted to a sufficient high voltage. As a result, in each of memory cells along such a word line, the voltage between the control gate and the p-type well becomes large, whereby a large erase stress is applied to the memory cells.

In FIG. 11, the coupling capacitance C1 between word lines in the parasitic capacitances of a word line tends to become large as miniaturizing the cell array. Therefore, performing the above described selective erase operation every word line, a large erase stress is applied to cells along a non-selected word line adjacent to a selected word line. This results in that the number of erase operations is limited, or such a case may occur that the erase operation becomes impossible.

SUMMARY OF THE INVENTION

According to an aspect of the present invention, there is provided a non-volatile semiconductor memory device including:

a cell array having electrically rewritable and non-volatile memory cells disposed at the respective intersections of word lines and bit lines intersecting each other;

a row decoder circuit for selectively driving a word line of the cell array;

a sense amplifier circuit disposed in communication with the cell array for data reading and writing; and a controller for executing sequence control of data write and erase, wherein in a data erase cycle controlled by the controller to erase memory cells disposed along at least one selected word line of the cell array, an adjacent/non-selected word line which is non-selected and adjacent to the selected word line in non-selected words lines in the cell array is precharged to a first erase-inhibition voltage, while the remaining non-selected word lines are precharged to a second erase-inhibition voltage.

DETAILED DESCRIPTION OF THE EMBODIMENTS

Illustrative embodiments of this invention will be explained with reference to the accompanying drawings below.

Figure 1:
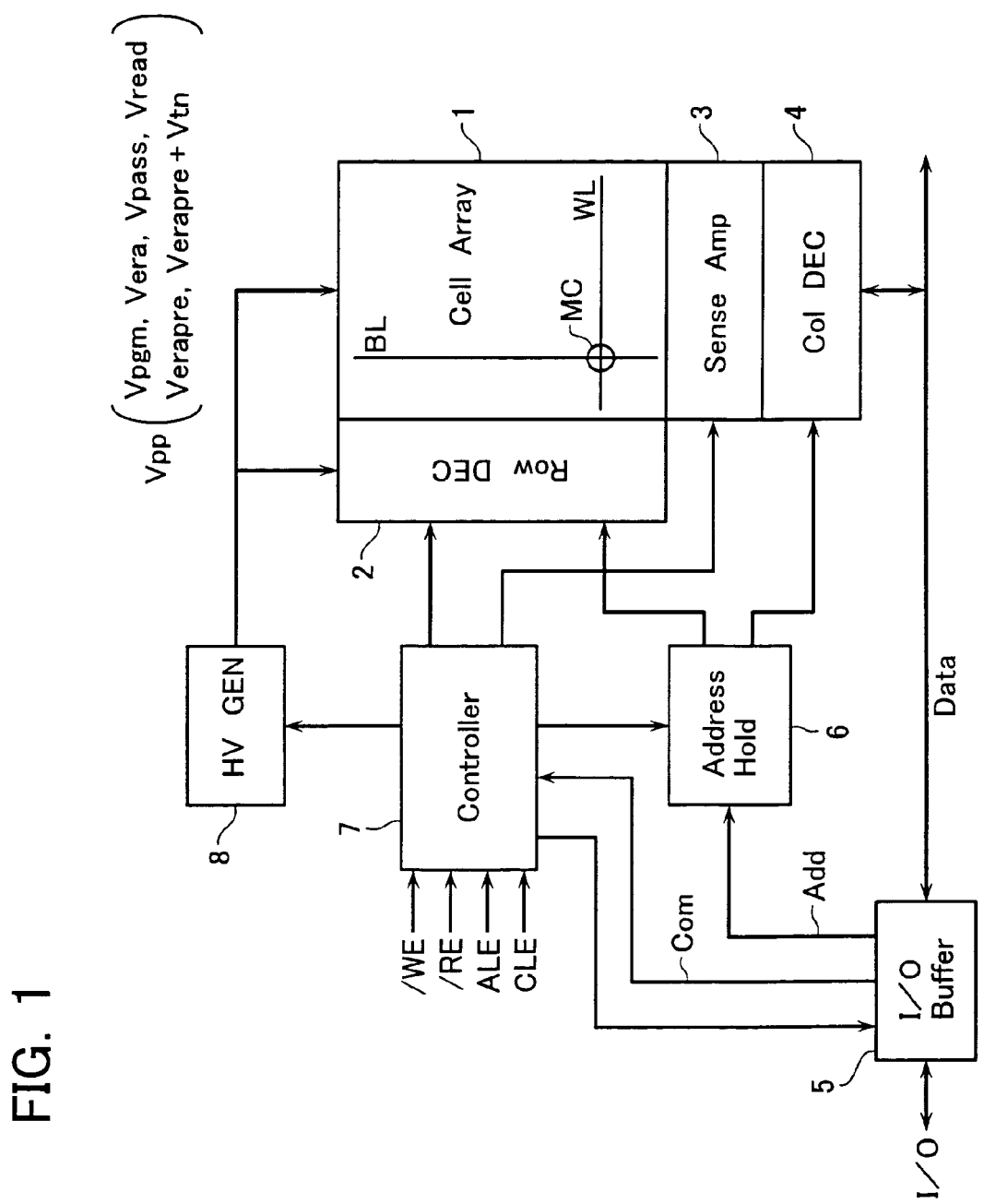
FIG. 1 shows a functional block configuration of a flash memory in accordance with an embodiment of the present invention.

FIG. 1 shows a functional configuration of a NAND-type flash memory in accordance with an embodiment. Arranging a plurality of floating-gate type memory cells MC in a matrix manner, a cell array 1 is formed. A row decoder circuit (including word line driver) 2 is disposed for driving word lines and select gate lines of the cell array 1. A sense amplifier circuit 3 has sense amplifiers and data latch circuits, and constitutes a page buffer which is used for data writing and reading by a page of the cell array 1.

One page read data in the sense amplifier circuit 3 may be selected by a column decoder (column gates) 4 to be output to the external I/O terminal through an I/O buffer 5. Write data supplied from the I/O terminal is selected by the column decoder 4 to be loaded in the sense amplifier circuit 3. One page write data is loaded in the sense amplifier circuit 3 and held until a data write cycle is finished. Address signal is input to an address hold circuit 6 through the I/O buffer 5 and transferred to the row decoder 2 and column decoder 4.

A controller 7 outputs various internal timing signals for use of write and ease sequence controls in response to external signals such as write enable signal/WE, read enable signal/RE, address latch signal ALE, command latch signal CLE and the like. Based on these internal signals, the controller 7 executes sequence controls of data write and erase, and a data read operation. A high voltage generation circuit 8 generates various high voltages Vpp for data writing and erasing under the control of the controller 7.

Figure 2:
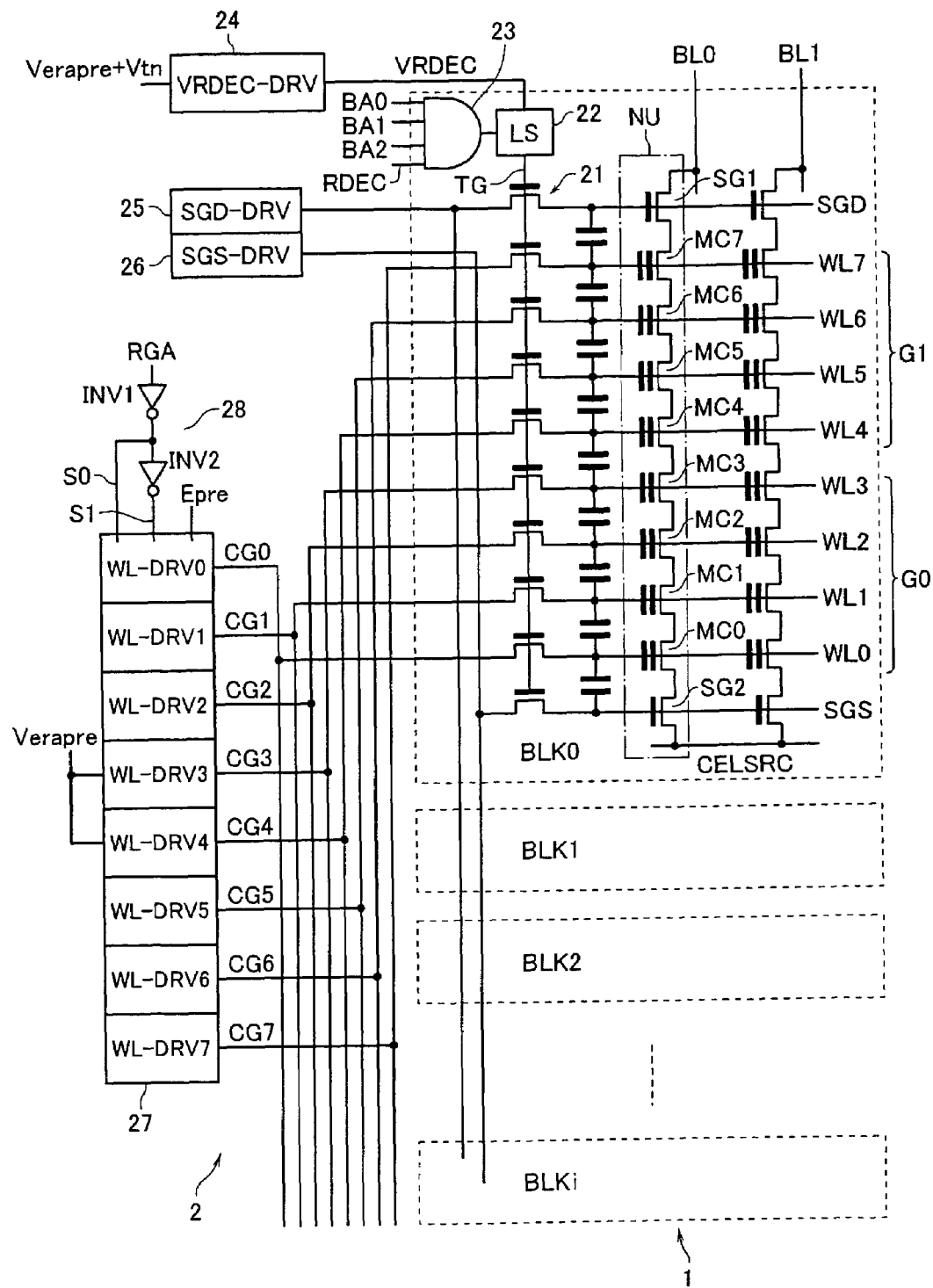
FIG. 2 shows a cell array and row decoder of the flash memory.

FIG. 2 shows a detailed configuration of the cell array 1 and the row decoder 2. The cell array 1 is formed of NAND cell units NU arranged therein, each of which has a plurality of (eight in this example) floating gate-type memory cells MC0–MC7. In detail, the NAND cell unit NU has a cell string in which plural memory cells MC0–MC7 are connected in series, a select gate transistor SG1 disposed between one end cell drain thereof and a bit line BL, and another select gate transistor SG2 disposed between the other end cell source and a source line CELSRS.

Control gates of the memory cells MC0–MC7 are connected to word lines WL0–WL7, respectively. Gates of the select gate transistors SG1 and SG2 are connected to select gate lines SGD and SGS disposed in parallel with the word lines, respectively. A group of memory cells arranged along a word line serves as a page. A group of NAND cell units arranged in the direction of the word line serves as a block. The cell array 1 shown in FIG. 2 has a plurality of blocks BLK0–BLKi arranged in the direction of the bit line BL. Further, FIG. 2 shows a case that one block is divided into two areas G0 and G1 (hereinafter, referred to as sub-blocks) in the direction of bit line BL. The sub-blocks G0 and G1 are defined as groups of memory cells selected by word lines WL0-3 and WL4-7, respectively, and each of them serves as a unit of data erase.

Row decoder circuit 2 has a word line driver circuit (WL-DRV) 27 used commonly to the entire blocks, a select gate driver circuit (SGD-DRV) 25 for driving the bit line side select gate line SGD, and another select gate driver circuit (SGS-DRV) 26 for driving the source line side select gate line SGS. For transferring drive voltages output from these driver circuits 25–27 to selected word lines WL0–WL7 and selected select gate lines SGD and SGS, respectively, block decoder 23 and transfer transistor array 21 with NMOS transistors arranged to be driven by the block decoder 23.

To common gate TG of transfer transistor array 21 of a selected block, a high voltage VRDEC output from a transfer transistor driver (VRDEC-DRV) 24 is supplied with a level conversion through a level shifter 22. Since the transfer transistor array 21, block decoder 23 and level shifter 22 are disposed for every block, these are shown in a block region surrounded by a dot line.

The word line driver circuit 27 has drivers WL-DRV0 to WL-DRV7 corresponding to the word lines WL0–WL7 in a block. Drive voltages obtained at output nodes CG0–CG7 are supplied to word lines WL0–WL7 in a selected block via the transfer transistor array 21. A sub-block decoder 28 is disposed to output select signals S0, S1 in response to sub-block address RGA for selecting sub-blocks G0, G1 in a block.

In the word line driver circuit 27, driver WL-DRV3 for driving word line WL3 disposed in the sub-block G0 to be adjacent to the sub-block G1, and driver WL-DRV4 for driving word line WL4 disposed in the sub-block G1 to be adjacent to the sub-block G0 have a specified configuration different from the remaining drivers. This is because that each of word lines WL3 and WL4 becomes a non-selected word line adjacent to a selected sub-block (i.e., selected word lines) in a data erase mode in which a sub-block serves as an erase unit. Hereinafter, in such a data erase mode in which a sub-block serves as an erase unit, a non-selected word line adjacent to a selected word line is referred to as an "adjacent/non-selected word line".

Each of the drivers WL-DRV3, WL-DRV4 is configured to output a precharge voltage Verapre to an adjacent/non-selected word line, which is different from ones applied to the remaining non-selected word lines, based on a timing signal Epre and sub-block select signals S0, S1 prior to the erase operation for a selected word line. The precharge voltage Verapre is one output from the high voltage generation circuit 8. To transfer the precharge voltage Verapre to a non-selected word line, another precharge voltage Verapre+Vtn is output from the high voltage generation circuit 8 and applied to the transfer transistor driver 24.

Figure 3:
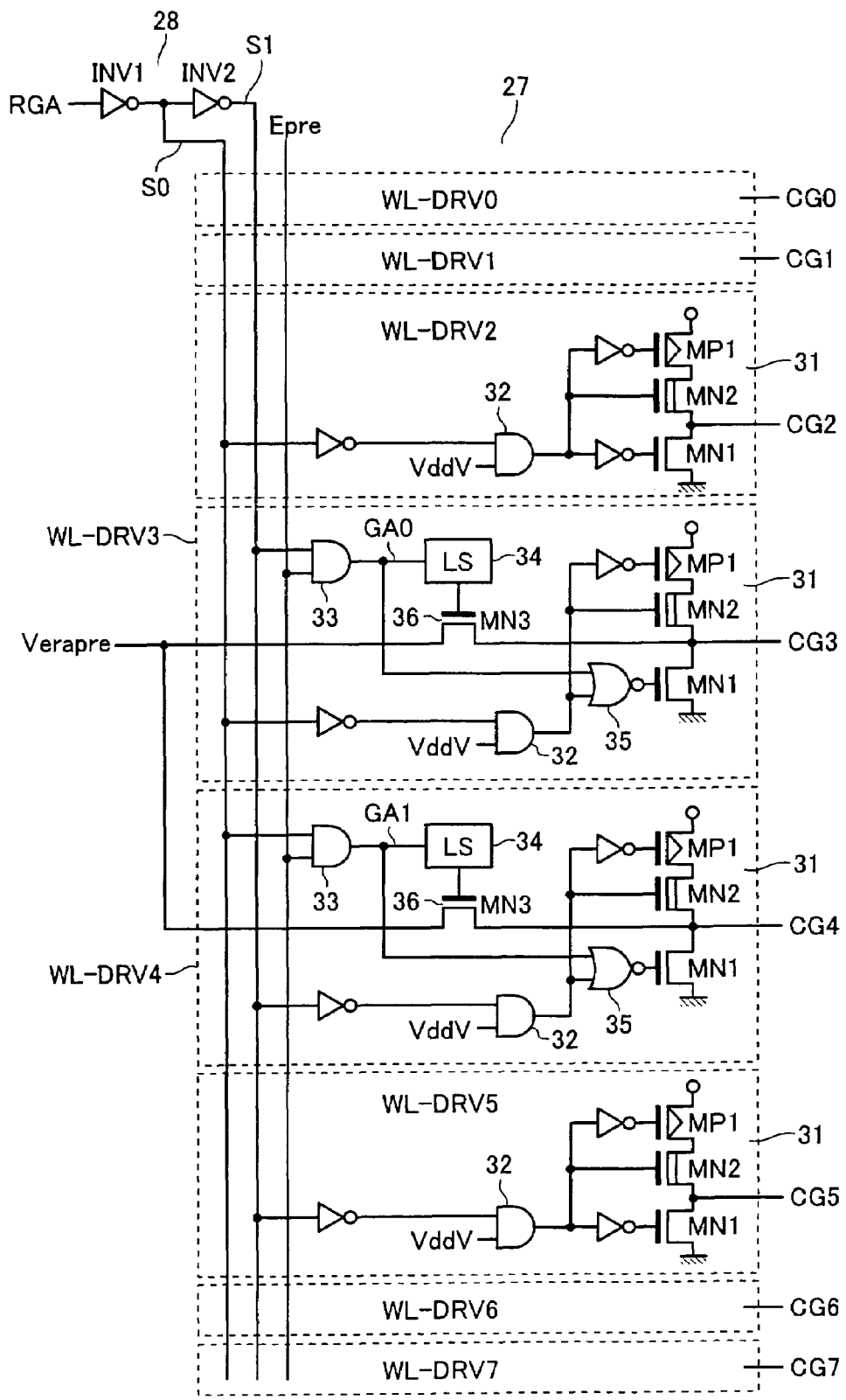
FIG. 3 shows a detailed configuration of the word line driver circuit in the row decoder.

FIG. 3 shows a detailed configuration of the word line driver circuit 27. The respective drivers WL-DRV0 to WL-DRV7 have output circuits 31 with the same configuration. The output circuit 31 has a pull-up PMOS transistor MP1 and a pull-down NMOS transistor MN1. Between the PMOS transistor MP1 and an output node CGi, a voltage limit-use D-type NMOS transistor MN2 is disposed. AND gates 32 are used for selectively driving the output circuits 31. AND gates 32 in the drivers WL-DRV0 to WL-DRV3 disposed in the sub-block G0 drive the output circuits 31 by logic of the select signal S0 and timing signal VddV. AND gates 32 in the drivers WL-DRV4 to WL-DRV7 disposed in the sub-block G1 drive the output circuits 31 by logic of the select signal S1 and the timing signal VddV.

Each output circuit 31 in each word line drivers selectively outputs power supply voltage Vdd or ground voltage Vss(=0V) to the output node CGi. Output ground voltage Vss is applied to a word line in a selected sub-block as an "erase-permission voltage". Output power supply voltage Vdd is used for applying an "erase-inhibition voltage", Vdd−Vtn, to a word line in a non-selected sub-block.

Drivers WL-DRV3 and WL-DRV4 for driving word lines WL3 and WL4, which are disposed in the respective boundary regions of the sub-blocks G0 and G1, have additional circuits in addition to the output circuit 31 for outputting different "erase-inhibition voltages", which are to be applied to adjacent/non-selected word lines, from that applied to the remaining non-selected word lines. In detail, there are prepared transfer gates 36 formed of NMOS transistors MN3 for transferring the precharge voltage (i.e., erase-inhibition voltage) Verapre to the output nodes CG3 and CG4, and AND gates 33 and level shifters 34 for selectively driving the transfer gates 36. The erase-inhibition voltage Verapre precharged to an adjacent/non-selected word line is higher than the erase-inhibition voltage Vdd−Vtn precharged to the remaining non-selected word lines.

In the driver WL-DRV3 for driving a boundary word line in the sub-block G0 side, output GA0 of the AND gate 33, which drives the NMOS transistor MN3, is an AND logic of the select signal S1 and precharge timing signal Epre. In the driver WL-DRV4 for driving a boundary word line in the sub-block G1 side, output GA1 of the AND gate 33, which drives the NMOS transistor MN3, is an AND logic of the select signal S0 and precharge timing signal Epre. These outputs GA0 and GA1 also are input to NOR gates 35 for driving the pull-down NMOS transistors MN1.

Note here that the word line driver circuit 27 in FIGS. 2 and 3 is disclosed only for a circuit portion used for dada erasing. In a data write operation, a boosted write voltage Vpgm is applied to a selected word line, and a medium voltage Vpass lower than Vpgm to non-selected word lines. In a data read operation, 0V (normal data read time) or verify voltage (verify-read time) is applied to a selected word line, and a pass voltage Vread necessary for turning on cells without regard to cell data is applied to non-selected word lines. Therefore, it is required to dispose drivers at the respective output nodes CG0 to CG7 for outputting various word line drive voltages used in correspondence with operation modes, which are omitted in FIGS. 2 and 3.

Figure 4:
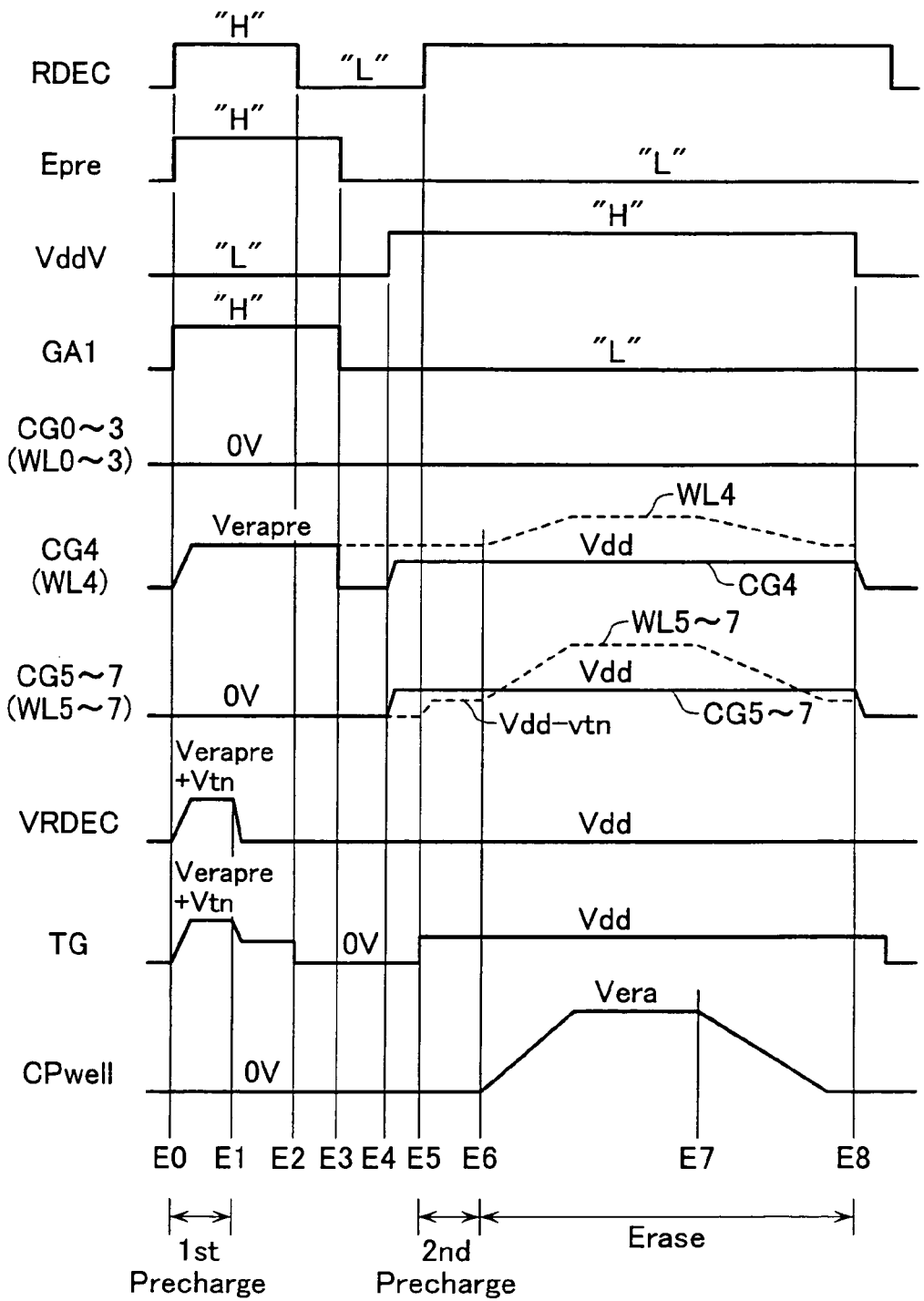
FIG. 4 shows a timing chart for explaining the data erase operation of the flash memory.

Next, a data erase operation will be explained referring to the timing chart of FIG. 4. This shows one of plural erase cycles controlled by the controller 7 with respect to a case that data erase is performed for sub-block G0 (i.e., word line area from WL0 to WL3) in a selected block in the cell array 1. In this case, within the word lines WL4 to WL7 in the non-selected sub-block G1, word line WL4 becomes an "adjacent/non-selected word line", because this is adjacent to a selected word line WL3. The sub-block G0 is selected by select address RGA="0". In response to this, sub-block select signals S0="1" and S1="0" are input to the word line driver circuit 27. Having been defined the select address, an activating signal RDEC becomes "H" at timing E0, thereby causing the block decoder 23 to be active. At the same time, the timing signal Epre becomes "H", thereby causing the high voltage generation circuit 8 to output precharge voltages Verapre and Verapre+Vtn (Vtn; threshold voltage of transistors in transistor array 21).

A period from E0 to E1 is a first word line precharge time. In this time, in response to the select signal S0="1"(="H") and timing signal Epre="H", the output GA1 of AND gate 33 in the driver WL-DRV4 becomes "H", whereby the level shifter 34 outputs "H". This "H" output of the level shifter 34, which is higher than Verapre+Vtn, drives the transfer transistor MN3 in the driver WL-DRV4 to turn on, whereby precharge voltage Verapre is output to the output node CG4.

In this time, in the driver WL-DRV3, the output GA0 of the AND gate 33 is held at "L", and the level shifter 34 outputs "L". Further, the output of the AND gate 32 is "L", whereby the output node CG3 is held at 0V. As similar to this, the AND gates 32 in the remaining drivers WL-DRV0 to WL-DRV3, and WL-DRV5 to WL-DRV7, output "L" in this time. Therefore output nodes CG0–CG3 and CG5–CG7 are held at 0V.

With respect to the selected block, as the block decoder 23 outputs "H" to turn on the level shifter 22, a voltage equal to or higher than Verapre+Vtn is applied to the gate TG of transfer transistor array 21. Therefore, the precharge voltage Verapre output at the output node CG3 is transferred to the adjacent/non-selected word line WL4 without voltage dropping through the transistor array 21. The remaining word lines are held at 0V.

Figure 5:
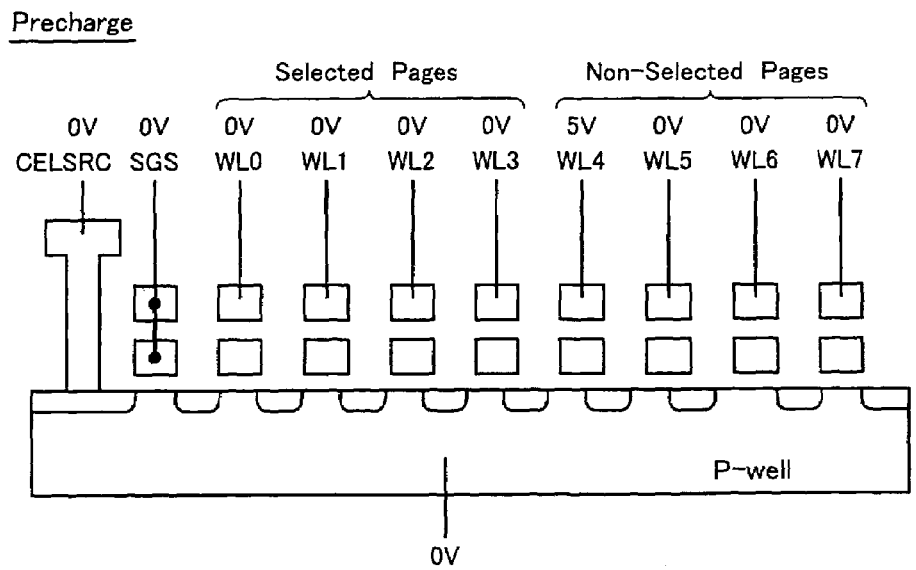
FIG. 5 shows a voltage relationship in the NAND cell unit at a first word line precharge time in the data erase cycle of the flash memory.

FIG. 5 shows a voltage relationship for a NAND cell unit in the selected block in this word line precharge time. This example shows a situation under the condition of that the precharge voltage Verapre is set at 5V. As apparent from FIG. 5, only the adjacent/non-selected word line WL4 in the non-selected sub-block is precharged to 5V.

Next, at timing E1, the output VRDEC of the transfer transistor driver 24 becomes Vdd, whereby the gate TG of the transistor array 21 is discharged to Vdd in correspondence with VRDEC. Then, the activating signal RDEC becomes "L" at timing E2, and in response to this, all block decoders 23 become to be a non-select state. Thereafter, the word line voltages transferred to the word lines are held in a floating state.

The timing signal Epre becomes "L" at timing E3. In response to this, in the driver WL-DRV4, the level shifter 34 outputs "L", and output node CG4 changes to 0V from Verapre.

Becoming "H" the timing signal VddV at timing E4, in the drivers WL-DRV0 to WL-DRV3 corresponding to the selected sub-block G0, AND gates 32 output "L", thereby causing the output nodes CG4 to CG7 to be Vdd.

Then, as the activating signal RDEC becomes "H" again at timing E5, a second word line precharge time starts. In detail, the block decoder 23 becomes in a selected state, whereby Vdd is transferred to the gate TG of the transistor array 21 in the selected block. At this time, node CG4 becomes Vdd, while the word line WL4 in communication with node CG4 has been precharged at Verapre. Therefore, the transfer transistor connected to the node CG4 is held off, whereby the word line WL4 is held at Verapre. The remaining non-selected word lines WL5 to WL7 in the non-selected sub-block G1 are charged to Vdd−Vtn by transferring Vdd of the nodes CG5–CG7 to be in a floating. In practice, the floating voltage of the word line WL4 is influenced by the adjacent word line WL5 as being charged up to be boosted a little.

Figure 6:
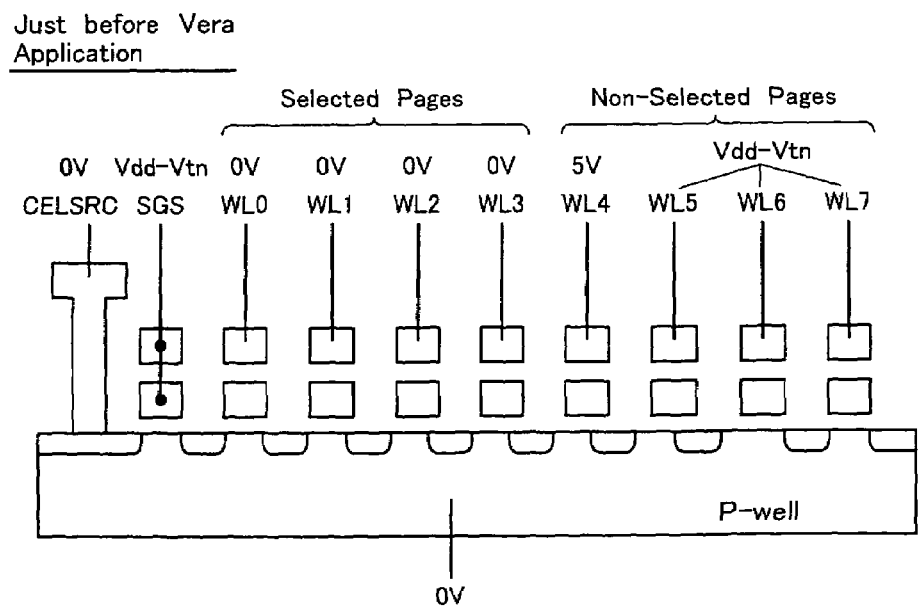
FIG. 6 shows a voltage relationship in the NAND cell unit at a second word line precharge time in the data erase cycle.

As a result of the above described word line precharge operations, as shown in FIG. 6, just before the erase voltage Vera application, the adjacent/non-selected word line WL4 in the non-selected sub-block G1 is set at a floating voltage Verapre, while the remaining word lines WL5–WL7 at a floating voltage Vdd−Vtn. In other words, the adjacent/non-selected word line WL4 and the remaining word lines WL5–WL7 are set at a floating state with different "erase-inhibition voltages" Verapre and Vdd−Vtn (where, Verapre>Vdd−Vtn), respectively. It should be appreciated that all word lines WL0–WL3 in the selected sub-block G0 are set at 0V (i.e., "erase-permission voltage" in the following erase time).

Figure 7:
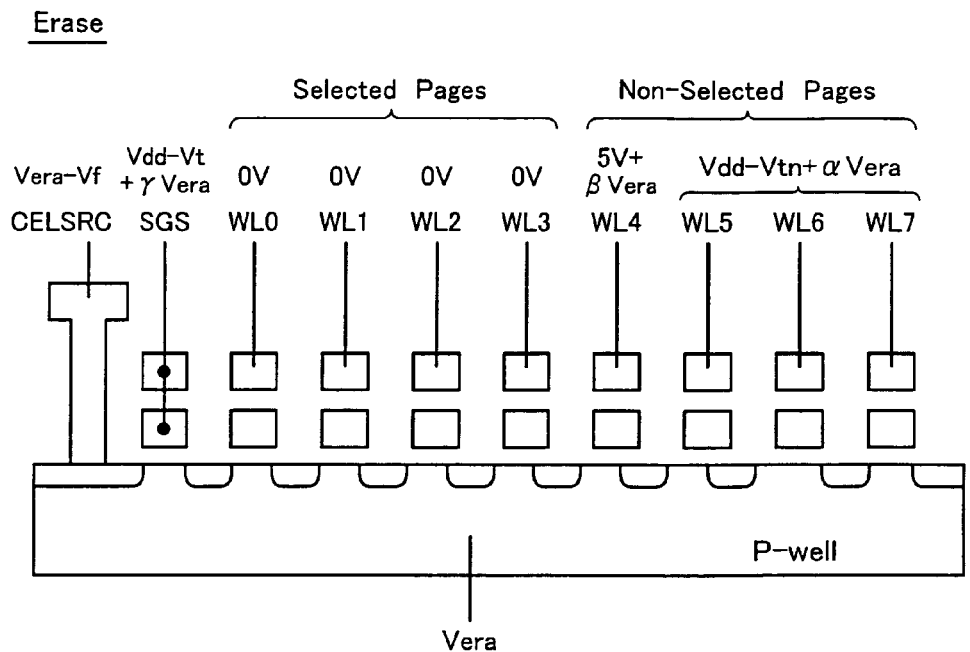
FIG. 7 shows a voltage relationship in the NAND cell unit at a data erase time in the data erase cycle.

At timing E6, erase voltage Vera is applied to a p-type well on which the cell array 1 is formed. The situation of the erase time is shown in FIG. 7. In the selected pages (i.e., selected sub-block G0), FN tunneling current is carried from floating gates to cell channels in all cells, whereby all cells are erased to be in "1" states.

In the non-selected pages (i.e., non-selected sub-block G1), word lines WL4–WL7 are boosted by capacitive coupling with the p-type well. In this case, the adjacent/non-selected word line WL4 is boosted from Verapre, while the remaining word lines WL5–WL7 from Vdd−Vtn. Further, the adjacent/non-selected word line WL4 is boosted with the coupling coefficient $\beta$, while the remaining word lines WL5–WL7 are with the coupling coefficient $\alpha$.

As described above, there is a relationship of $\beta$Vera<$\alpha$Vera. On the other hand, the initial voltage of the adjacent/non-selected word line has been precharged to a level higher than that of the remaining word lines. Therefore, setting the precharge voltage Verapre to satisfy a condition of; Verapre+$\beta$Vera=Vdd−Vtn+$\alpha$Vera, the entire word lines WL4–WL7 in the non-selected pages become to have a substantially identical erase-inhibition voltage in the erase time shown in FIG. 7. This prevents the cells arranged along the adjacent/non-selected word line WL4 from being disturbed by a large erase stress.

The erase voltage Vera is pulled down at timing E7 after having been applied for a certain period, then the timing signal VddV becomes "L" at timing E8. Finally, letting the activating signal RDEC be "L", the erase operation ends. Usually, data erase is executed with a plurality of erase cycles in each of which the above described erase operation is performed, and then a verify-read operation is performed for verifying the erase state.

Figure 8:
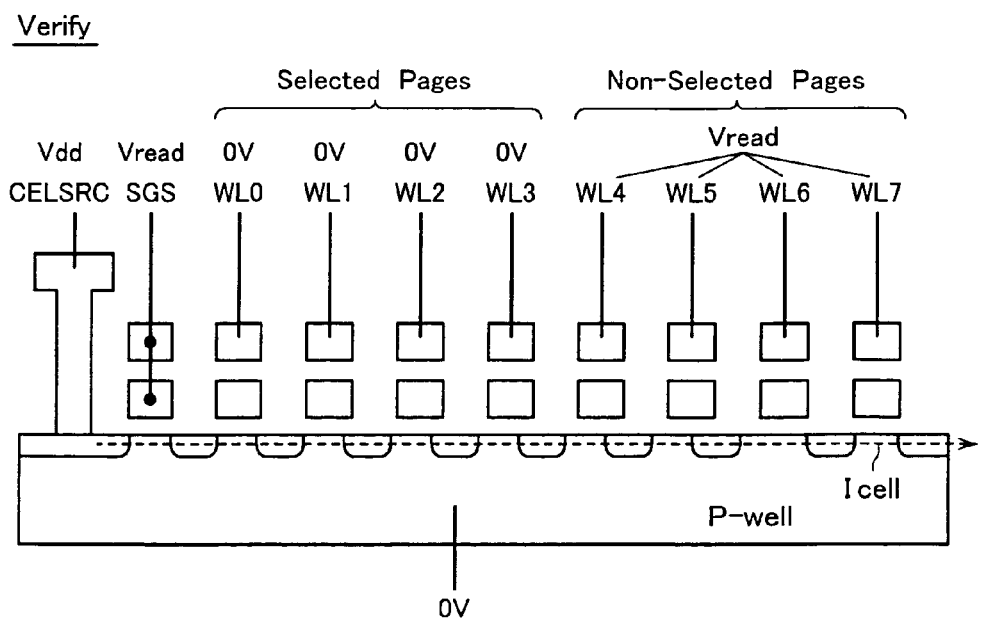
FIG. 8 shows a voltage relationship in the NAND cell unit at a verify time in the data erase cycle.
Figure 9:
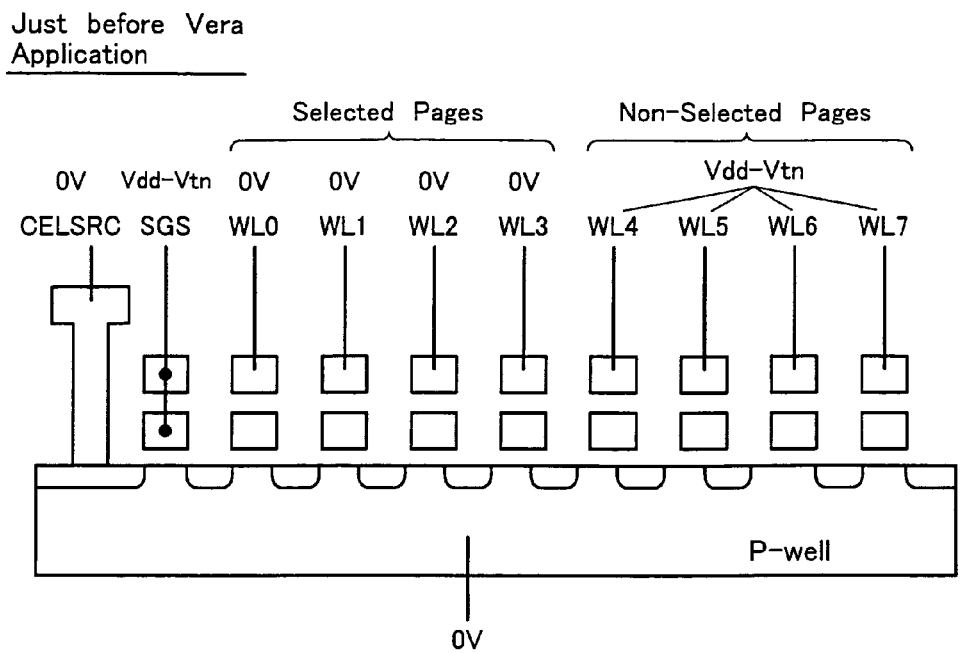
FIG. 9 shows a voltage relationship in the NAND cell unit before the erase voltage application in the conventional selective data erase.
Figure 10:
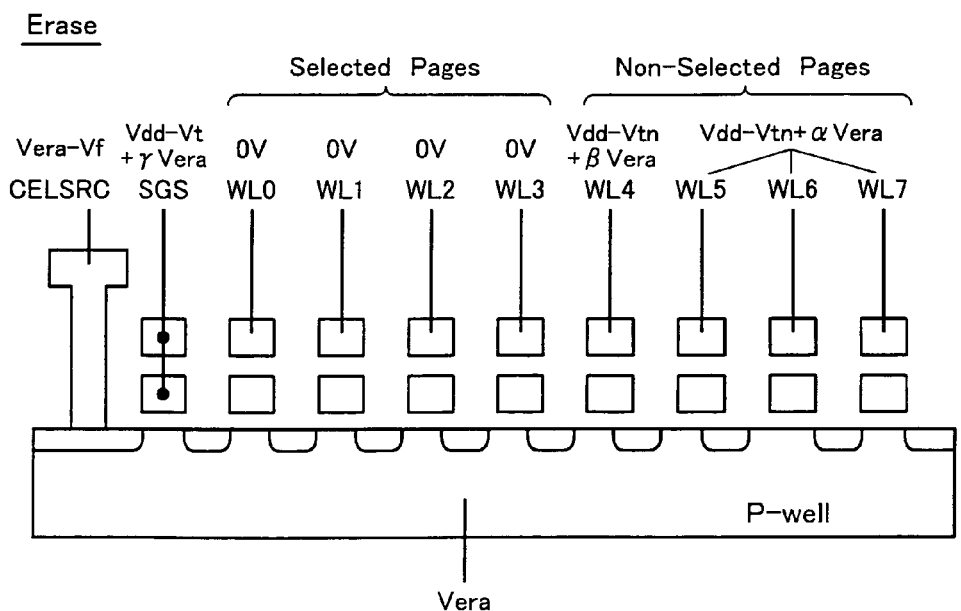
FIG. 10 shows a voltage relationship in the NAND cell unit at the erase voltage application time in the conventional selective data erase.
Figure 11:
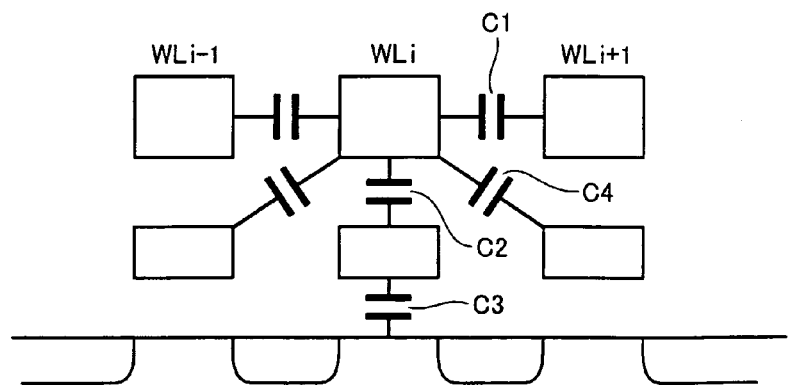
FIG. 11 shows capacitive coupling between memory cells in a NAND cell unit.

FIG. 8 shows a voltage relationship in the verify-read operation. In this example, verify-read is done in such a manner as to carry cell current from the source line CELSRC to the bit line BL. To do this, Vdd is applied to the source line CELSRC, pass voltage Vread to select gate line SGS at the source line side and word lines WL4–WL7 in the non-selected area, and verify judgment voltage 0V to word lines WL3—WL3 in the selected area, respectively. If all memory cells in the selected area have been erased to have negative threshold, cell current Icell is carried as shown by a dot line in FIG. 8. Charging the bit line by the cell current, a voltage is obtained at the bit line, which corresponds to an absolute value of the negative threshold of the noticed cells. Sensing the bit line voltage by the sense amplifier circuit, the data erase state may be verified.

As described above, when data erase is performed by a selected sub-block in the NAND flash memory of this the embodiment, it is performed a selective precharge operation for an adjacent/non-selected word line in the non-selected sub-block, which is adjacent to the selected sub-block. As a result, erase stress applied to memory cells disposed along the adjacent/non-selected word line may be reduced. Although, the more miniaturized the cell array, the larger the influence of capacitive coupling between word lines, it becomes possible to perform data erase by a sub-block under a small erase stress.

While one block is divided into two sub-blocks in the direction of the bit line in the above described embodiment, it is permitted to divide into three or more sub-blocks, and perform data erase by a sub-block. Further, one sub-block may be defined by one page.

As an embodiment, an electric card using the non-volatile semiconductor memory device according to the above-described embodiment of the present invention and an electric device using the card will be described bellow.

Figure 12:
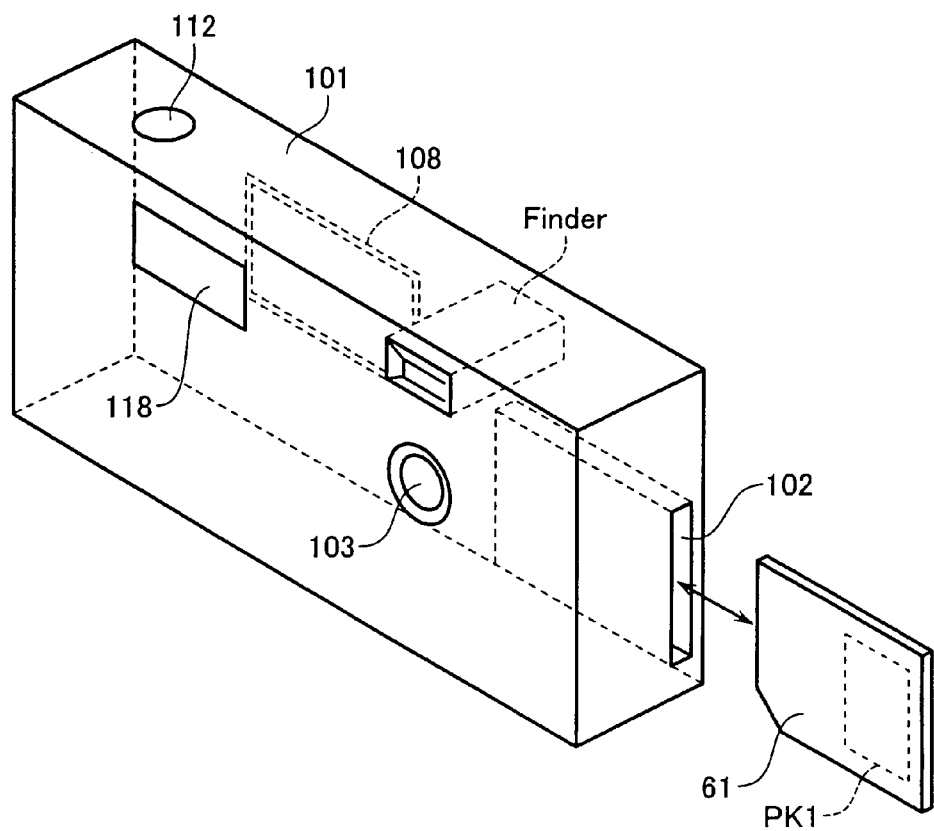
FIG. 12 shows a digital still camera to which the embodiment is adapted.

FIG. 12 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically-connected to electric circuits of the circuit board.

If this electric card is a non-contact type IC card, it is electrically connected to the electric circuits on the circuit board by radio signals when inserted in or approached to the card slot 102.

Figure 13:
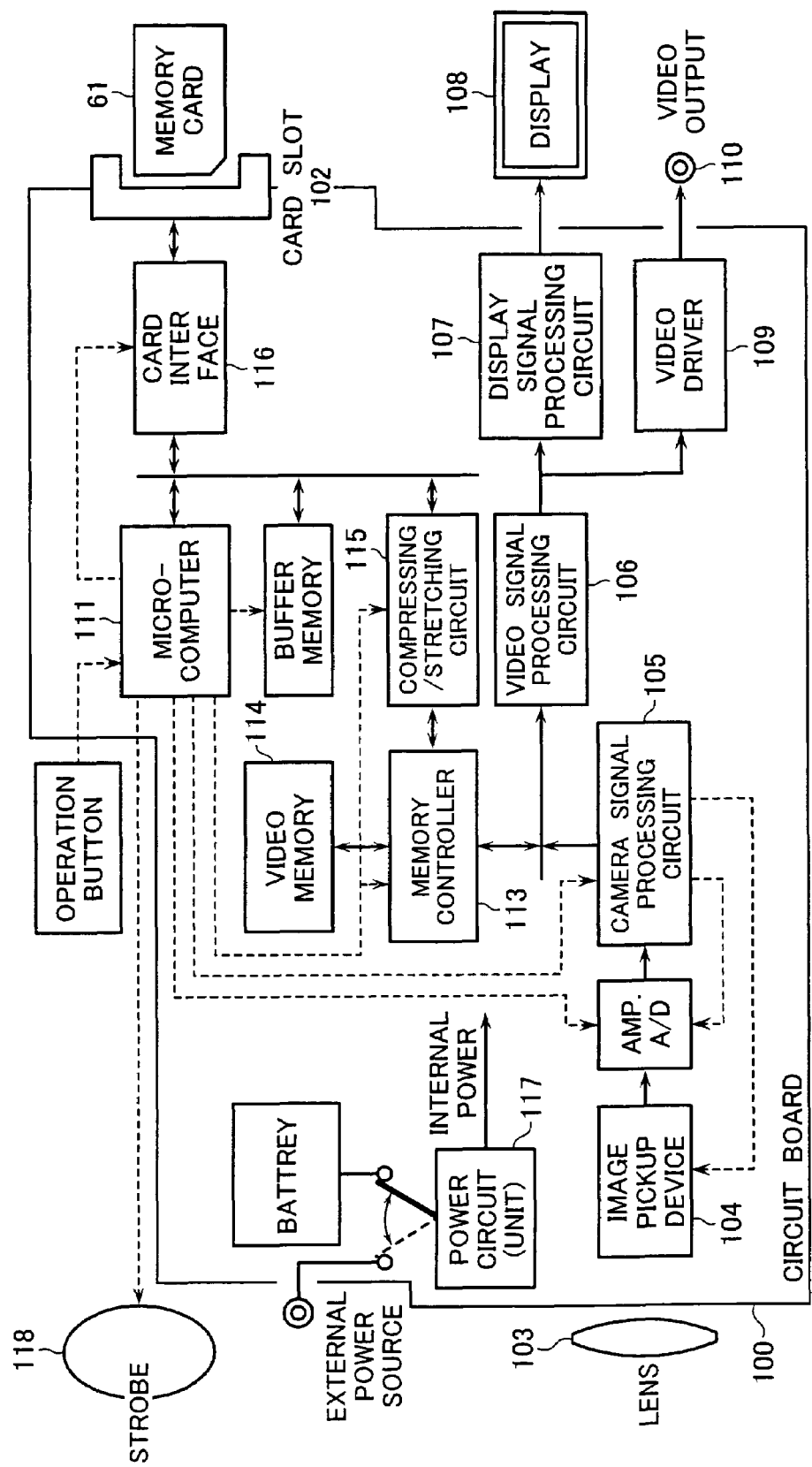
FIG. 13 shows an internal configuration of the digital still camera.
Figure 14A:
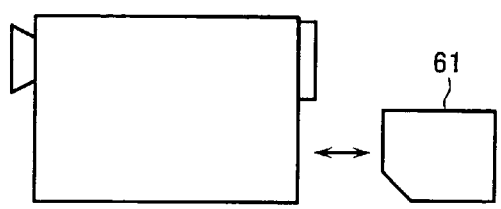
FIGS. 14A to 14J show other devices to which the embodiment is adapted.
Figure 14F:
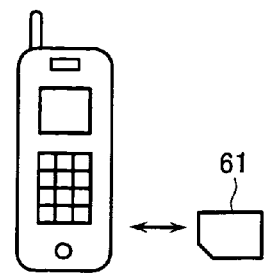
Figure 14B:
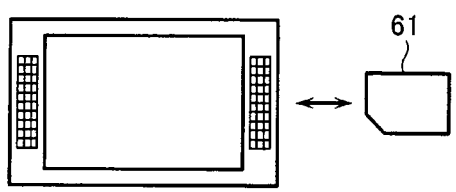
Figure 14G:
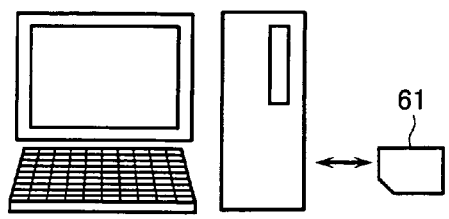
Figure 14C:
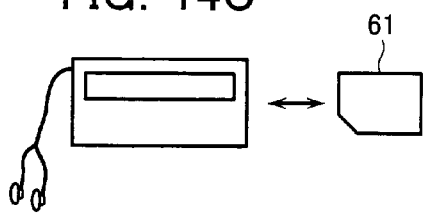
Figure 14H:
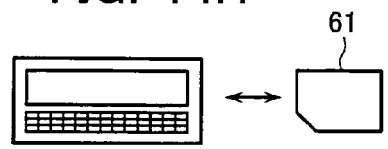
Figure 14D:
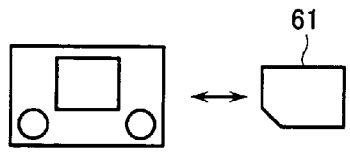
Figure 14I:
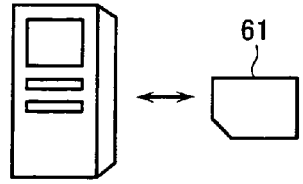
Figure 14E:
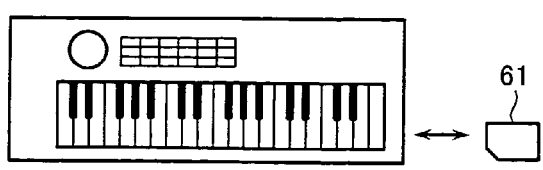
Figure 14J:
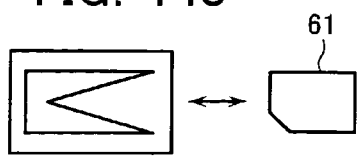

FIG. 13 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 14A to 14J, as well as in portable electric devices. That is, the electric card can also be used in a video camera shown in FIG. 14A, a television set shown in FIG. 14B, an audio apparatus shown in FIG. 14C, a game apparatus shown in FIG. 14D, an electric musical instrument shown in FIG. 14E, a cell phone shown in FIG. 14F, a personal computer shown in FIG. 14G, a personal digital assistant (PDA) shown in FIG. 14H, a voice recorder shown in FIG. 14I, and a PC card shown in FIG. 14J.

While the embodiment has been described for a NAND flash memory, the present invention may be applied to other flash memories of, for example, NOR-type, DINOR-type and the like.

Further, it will be understood by those skilled in the art that various changes in form and detail may be made without departing from the spirit, scope, and teaching of the invention.

What is claimed is:

1. A non-volatile semiconductor memory device comprising:
    a cell array having electrically rewritable and non-volatile memory cells disposed at the respective intersections of word lines and bit lines intersecting each other;
    a row decoder circuit for selectively driving a word line of said cell array;
    a sense amplifier circuit disposed in communication with said cell array for data reading and writing; and
    a controller for executing sequence control of data write and erase, wherein
    in a data erase cycle controlled by said controller to erase memory cells disposed along at least one selected word line of said cell array, an adjacent/non-selected word line which is non-selected and adjacent to said selected word line in non-selected word lines in said cell array is precharged to a first erase-inhibition voltage, while the remaining non-selected word lines are precharged to a second erase-inhibition voltage.

2. The non-volatile semiconductor memory device according to claim 1, wherein
    said data erase cycle comprises:
    a first precharge time for precharging said adjacent/non-selected word line to said first erase-inhibition voltage;
    a second precharge time for precharging the remaining non-selected word lines to said second erase-inhibition voltage lower than said first erase-inhibition voltage after said first precharge time, while said adjacent/non-selected word line is held at said first erase-inhibition voltage; and
    an erase time for erasing memory cells disposed along said selected word line after said second precharge time by applying an erase-permission voltage to said selected word line and applying an erase voltage to a semiconductor well on which said cell array is formed.

3. The non-volatile semiconductor memory device according to claim 1, wherein
    said cell array comprises a plurality of NAND cell units arranged in a matrix manner therein, each NAND cell unit comprising a cell string with plural memory cells connected in series and driven by different word lines from each other, a first select gate transistor disposed for connecting one end of said string to a bit line and driven by a first select gate line disposed in parallel with said word lines, and a second select gate transistor disposed for connecting the other end of said string to a source line and driven by a second select gate line disposed in parallel with said word lines.

4. The non-volatile semiconductor memory device according to claim 3, wherein
    said cell array comprises at least one block defined as a group of plural NAND cell units arranged in the direction of said word lines, said block being divided into at least two sub-blocks in the direction of said bit lines, and wherein
    data erase is performed by each sub-block.

5. The non-volatile semiconductor memory device according to claim 4, wherein
    said data erase cycle comprises:
    a first precharge time for precharging an adjacent/non-selected word line disposed in a non-selected sub-block and adjacent to a selected sub-block to said first erase-inhibition voltage;
    a second precharge time for precharging the remaining non-selected word lines to said second erase-inhibition voltage lower than said first erase-inhibition voltage after said first precharge time, while said adjacent/non-selected word line is held at said first erase-inhibition voltage; and an erase time for erasing memory cells in said selected sub-block after said second precharge time by applying an erase-permission voltage to one or more word lines in said selected sub-block and applying an erase voltage to a semiconductor well on which said cell array is formed.

6. The non-volatile semiconductor memory device according to claim 5, wherein said row decoder circuit comprises:

a word line driver circuit having plural word line drivers for outputting driving voltages necessary for the respective word lines in said block; and a transfer transistor array having plural transfer transistors for transferring said driving voltages to the respective word lines.

7. The non-volatile semiconductor memory device according to claim 6, wherein each of said word line drivers comprises an output circuit for applying said erase-permission voltage to a selected word line and for applying said second erase-inhibition voltage to a non-selected word line, and wherein ones of said plural word line drivers, which are in communication with word lines disposed at boundary areas in the respective sub-blocks, each comprises a transfer gate in addition to said output circuit for selectively transferring said first erase-inhibition voltage to a corresponding word line based on a sub-block select signal and a timing signal.

8. The non-volatile semiconductor memory device according to claim 5, wherein said data erase cycle further comprises a verify-read time for detecting cell current carried from said source line to said bit line after said erase time with applying a verify judging voltage to word lines in the selected sub-block and a pass voltage to word lines in the unselected sub-block, the pass voltage being set to turn on cells without regard to cell data.

9. A non-volatile semiconductor memory device comprising:

a cell array having a plurality of NAND cell units arranged in a matrix manner therein, each NAND cell unit comprising a cell string with electrically rewritable and non-volatile memory cells connected in series and driven by different word lines from each other, a first select gate transistor disposed for connecting one end of said cell string to a bit line and driven by a first select gate line disposed in parallel with said word lines, and a second select gate transistor disposed for connecting the other end of said cell string to a source line and driven by a second select gate line disposed in parallel with said word lines;

a row decoder circuit for selectively driving a word line of said cell array, said row decoder circuit precharging, in a data erase cycle for erasing memory cells disposed along at least one selected word line of said cell array, an adjacent/non-selected word line in non-selected words lines, which is non-selected and adjacent to said selected word line to a first erase-inhibition voltage and precharging the remaining non-selected word lines to a second erase-inhibition voltage in said data erase cycle;

a sense amplifier circuit disposed in communication with said cell array for data reading and writing; and a controller for executing sequence control of data write and erase.

10. The non-volatile semiconductor memory device according to claim 9, wherein said cell array comprises at least one block defined as a group of plural NAND cell units arranged in the direction of said word lines, said block being divided into at least two sub-blocks in the direction of said bit lines, and wherein data erase is performed by each sub-block.

11. The non-volatile semiconductor memory device according to claim 9, wherein said data erase cycle controlled by said controller comprises:

a first precharge time for precharging said adjacent/non-selected word line to said first erase-inhibition voltage;

a second precharge time for precharging the remaining non-selected word lines to said second erase-inhibition voltage lower than said first erase-inhibition voltage after said first precharge time, while said adjacent/non-selected word line is held at said first erase-inhibition voltage; and an erase time for erasing memory cells disposed along said selected word line after said second precharge time by applying an erase-permission voltage to said selected word line and applying an erase voltage to a semiconductor well on which said cell array is formed.

12. The non-volatile semiconductor memory device according to claim 11, wherein said data erase cycle controlled by said controller further comprises a verify-read time after said erase time for detecting cell current carried from said source line to said bit line by applying a verify-judgment voltage to word lines in a selected sub-block, and by applying a pass voltage to word lines in a non-selected sub-block, said pass voltage being possible to turn on cells without regard to cell data.

13. The non-volatile semiconductor memory device according to claim 10, wherein said row decoder circuit comprises:

a word line driver circuit having plural word line drivers for outputting driving voltages necessary for the respective word lines in said block; and a transfer transistor array having plural transfer transistors for transferring said driving voltages to the respective word lines.

14. The non-volatile semiconductor memory device according to claim 13, wherein each of said word line drivers comprises an output circuit for applying said erase-permission voltage to a selected word line and for applying said second erase-inhibition voltage to a non-selected word line, and wherein ones of said plural word line drivers, which are in communication with word lines disposed at boundary areas in the respective sub-blocks, each comprises a transfer gate in addition to said output circuit for selectively transferring said first erase-inhibition voltage to a corresponding word line based on a sub-block select signal and a timing signal.

15. An electric card equipped with a memory system defined in claim 1.

16. An electric device comprising:

a card interface;

a card slot connected to said card interface; and an electric card defined in claim 15 and electrically connectable to said card slot.

17. The electric device according to claim 16, wherein said electric device is a digital still camera.

* * * * *